(12) United States Patent
Park

(10) Patent No.: US 7,977,216 B2
(45) Date of Patent: Jul. 12, 2011

(54) SILICON WAFER AND FABRICATION METHOD THEREOF

(75) Inventor: Jung-Goo Park, Chungcheongbuk-do (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 12/500,901

(22) Filed: Jul. 10, 2009

(65) Prior Publication Data

US 2010/0078767 A1   Apr. 1, 2010

(30) Foreign Application Priority Data

Sep. 29, 2008 (KR) .................. 10-2008-0095462
Jan. 16, 2009 (KR) .................. 10-2009-0003697

(51) Int. Cl.
*H01L 21/00* (2006.01)
*H01L 21/20* (2006.01)
*H01L 21/36* (2006.01)
*H01L 21/322* (2006.01)

(52) U.S. Cl. ........ 438/477; 438/479; 438/509; 438/689; 438/795; 438/799; 257/E21.321; 257/E21.324

(58) Field of Classification Search ........... 257/E21.321, 257/E21.324
See application file for complete search history.

(56) References Cited

U.S. PATENT DOCUMENTS

| | | | | |
|---|---|---|---|---|
| 5,693,976 A * | 12/1997 | Chao | .................... | 257/412 |
| 6,599,815 B1 * | 7/2003 | Yang | .................... | 438/471 |
| 6,642,123 B2 * | 11/2003 | Mun et al. | .................... | 438/402 |
| 6,686,260 B2 * | 2/2004 | Falster et al. | .................... | 438/473 |
| 7,078,357 B2 * | 7/2006 | Tobe et al. | .................... | 438/795 |
| 7,521,382 B2 * | 4/2009 | Falster et al. | .................... | 438/795 |
| 2002/0179006 A1 * | 12/2002 | Borgini et al. | .................... | 117/95 |
| 2005/0054124 A1 | 3/2005 | Man et al. | | |
| 2005/0164438 A1 | 7/2005 | Okonogi et al. | | |
| 2006/0075960 A1 * | 4/2006 | Borgini et al. | .................... | 117/200 |
| 2007/0169688 A1 * | 7/2007 | Yoon et al. | .................... | 117/94 |
| 2008/0075138 A1 * | 3/2008 | Wee et al. | .................... | 374/5 |
| 2009/0197396 A1 * | 8/2009 | Qu | .................... | 438/473 |

FOREIGN PATENT DOCUMENTS

| | | |
|---|---|---|
| JP | 02007437 | 1/1990 |
| JP | 05218051 | 8/1993 |
| JP | 2000114176 | 4/2001 |
| KR | 10 2005 0024994 A | 3/2005 |
| KR | 10 2006 0072691 A | 6/2006 |

OTHER PUBLICATIONS

Izunome etal., Oxygen precipitation in Czochralski-grown silicon wafers during hydrogen annealing, Jan. 1, 1996, Appl. Phys. Lett., vol. 68, No. 1, pp. 49-50.*

(Continued)

*Primary Examiner* — Charles D Garber
*Assistant Examiner* — Mohsen Ahmadi
(74) *Attorney, Agent, or Firm* — NSIP Law

(57) ABSTRACT

Provided is a silicon wafer including: a first denuded zone formed with a predetermined depth from a top surface of the silicon wafer; and a bulk area formed between the first denuded zone and a backside of the silicon wafer, wherein the first denuded zone is formed with a depth ranging from approximately 20 um to approximately 80 um from the top surface, and wherein a concentration of oxygen in the bulk area is uniformly distributed within a variation of 10% over the bulk area.

12 Claims, 18 Drawing Sheets

OTHER PUBLICATIONS

Poggi et al., "Denuded Zone Stability in a SPAD Diode as a Function of Out-Diffusion Parameters", IEEE Transaction on Electron Devices, vol. ED-34, No. 7, Jul. 1987.*

Extended European Search Report issued on Jan. 28, 2011, in corresponding European Application No. 09 25 2132 (9 pages).

Craven et al., "Internal Gettering in Silicon," *Solid State Technology*, vol. 24, No. 7, Jul. 1981, pp. 55-61.

Graff et al., "Monitoring of Internal Gettering during Bipolar Processes," *Journal of the Electrochemical Society*, vol. 135, No. 4, Apr. 1988, pp. 952-957.

Swaroop, "Advances in Silicon Technology for the Semiconductor Industry," *Solid State Technology*, vol. 26, No. 7, Jul. 1983, pp. 97-101.0.

* cited by examiner

Si dislocation

SILICON WAFER AND FABRICATION METHOD THEREOF

CROSS-REFERENCES TO RELATED APPLICATIONS

The present invention claims priority of Korean Patent Application Nos. 10-2008-0095462 and 10-2009-0003697, filed with Korean Intellectual Property Office on Sep. 29, 2008 and Jan. 16, 2009, which are incorporated herein by reference.

BACKGROUND OF THE INVENTION

1. Field of the Invention

The present invention relates to semiconductor fabricating technology, and more particularly, to a silicon wafer and a method for fabricating the same.

2. Description of Related Art

In most high-voltage devices such as NMOS transistors and PMOS transistors, a well is formed to a depth of approximately 5-10 μm from a surface of a substrate generally. It is difficult to achieve a doping profile of a well having a depth of 5-10 μm only using an ion implantation process. For this reason, a dopant diffusion process should be necessarily performed using high-temperature heat treatment after the ion implantation process.

However, an oxygen precipitation is not completely achieved in a silicon bulk due to the high-temperature heat treatment. This causes crystal defects such as a ring-shaped dislocation to occur in a silicon substrate after an etching process for shallow trench isolation (STI).

In addition, these crystal defects reduce production yield, and also deteriorate electrical parameter characteristics such as a threshold voltage of a high voltage device and leakage current uniformity during a standby mode of a static random access memory (SRAM). Furthermore, these crystal defects increase a time taken to inspect and analyze lots of defects during an impurity inspection process that is inevitably performed to fabricate a semiconductor device, resulting in an increase in an overall processing time for fabricating the semiconductor device.

SUMMARY OF THE INVENTION

An embodiment of the present invention is directed to a silicon wafer for preventing crystal defects from being generated due to a thermal budget caused by a following high-temperature heat treatment process by sufficiently increasing gettering sites.

Another embodiment of the present invention is directed to a silicon wafer having high and uniform bulk micro defect (BMD) density in a bulk area.

Another embodiment of the present invention is directed to a method for fabricating a silicon wafer to prevent crystal defects from being generated due to a thermal budget caused by a following high-temperature heat treatment process by sufficiently increasing gettering sites.

Another embodiment of the present invention is directed to a method for fabricating a silicon wafer having a high and uniform bulk micro defect (BMD) density in bulk area.

Another embodiment of the present invention is directed to a semiconductor device fabricated by using the above described silicon wafer.

Another embodiment of the present invention is directed to a method for fabricating a semiconductor device by using the above described method for fabricating the silicon wafer.

In accordance with an aspect of the present invention, there is provided a silicon wafer, including: a first denuded zone formed with a predetermined depth from a top surface of the silicon wafer; and a bulk area formed between the first denuded zone and a backside of the silicon wafer, wherein the first denuded zone is formed with a depth ranging from approximately 20 um to approximately 80 um from the top surface, and wherein a concentration of oxygen in the bulk area is uniformly distributed within a variation of 10% over the bulk area.

In accordance with further another aspect of the present invention, there is provided a method for fabricating a silicon wafer, including: providing the silicon wafer having a denuded zone and a bulk area; performing a first annealing process on the silicon wafer at a first temperature to supplementarily generate oxygen precipitate nuclei and oxygen precipitates in the bulk area; and performing a second annealing process on the silicon wafer at a second temperature higher than the first temperature to enlarge the oxygen precipitates in the bulk area.

In accordance with still another aspect of the present invention, there is provided a method for fabricating a silicon wafer, including: providing the silicon wafer; loading the silicon wafer into inside of a heating apparatus at a loading temperature; performing a first heating-up process of heating up the silicon wafer from the loading temperature to a first temperature; performing a first annealing process of annealing the silicon wafer at the first temperature to generate oxygen precipitates; performing a second heating-up process of heating up the silicon wafer from the first temperature to a second temperature higher than the first temperature; performing a second annealing process of annealing the silicon wafer at the second temperature to enlarge the oxygen precipitates for increasing a density thereof; performing a cooling-down process of cooling down the silicon wafer from the second temperature to an unloading temperature; and unloading the silicon wafer to outside from the heating apparatus.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The present invention can accomplish high and uniform BMD density in a bulk area using a two-step annealing process to a wafer silicon. As a result, the present invention can prevent crystal defects from being generated due to a thermal budget caused by a following high-temperature heat treatment process by sufficiently increasing gettering sites.

Figure 1:
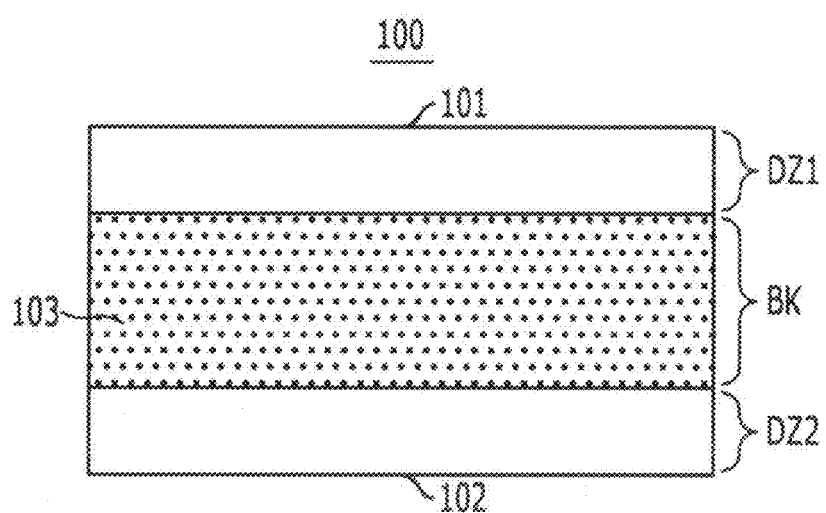
FIG. 1 is a cross-sectional view of a silicon wafer in accordance with an embodiment of the present invention.

FIG. 1 is a cross-sectional view of a silicon wafer in accordance with an embodiment of the present invention.

As shown in FIG. 1, the silicon wafer 100 includes a first denuded zone DZ1 formed with a predetermined depth from a top surface 101, and a bulk area BK formed between the first denuded zone DZ1 and a backside 102. The silicon wafer 100 further includes a second denuded zone DZ2 formed with a predetermined depth from the backside 102 in the direction of the top surface 101.

The first denuded zone DZ1 formed with a predetermined depth from the top surface 101 in the direction of the backside 102 is a defect free zone (DFZ) which is free from crystal defects such as vacancy and dislocation. Preferably, the first denuded zone DZ1 is formed with a depth ranging from approximately 20 um to approximately 80 um from the top surface 101 in the direction of the backside 102.

The second denuded zone DZ2 is also a DFZ and formed with the same depth as that of the first denuded zone DZ1 from the backside 102 in the direction of the top surface 101, or formed with a depth smaller than that of the first denuded zone DZ1 according to a polishing process to the backside 102. That is, when both the top surface 101 and the backside 102 of the silicon wafer 100 are mirror-polished without discrimination, the first and second denuded zones DZ1 and DZ2 are formed with the same depth. On the contrary, when the top surface 101 is mirror-polished and the backside 102 is not mirror-polished, the second denuded zone DZ2 is formed with a depth smaller than that of the first denuded zone DZ1 because oxygen precipitates are formed to close to the backside 102 according to roughness of the backside 102.

The bulk area BK formed between the first and second denuded zones DZ1 and DZ2 includes Bulk Micro-Defects (BMDs) 103. The BMDs 103 are uniformly maintained in the whole bulk area. The BMDs 103 include a precipitate and a bulk stacking fault. Further, the BMDs 103 in the bulk area BK may be controlled to have sufficient density, thereby gettering metallic contaminations to be diffused over the surface of the silicon wafer through a following high-temperature heat treatment process or a thermal process. Preferably, the BMDs 103 in the bulk area BK may maintain the density from approximately $1*10^5$ ea/cm$^2$ to approximately $1*10^7$ ea/cm$^2$, and more preferably, from approximately ea/cm$^2$ $1*10^{6*}$ to $1*10^7$ ea/cm$^2$. A concentration of oxygen (Hereinafter, referring to as an 'oxygen concentration') in the bulk area BK is closely related to the oxygen precipitates, and preferably, the oxygen concentration may be distributed within a variation of 10% over the bulk area BK and maintained from approximately 10.5 to approximately 13 PPMA (Parts Per Million Atom).

Figure 2:
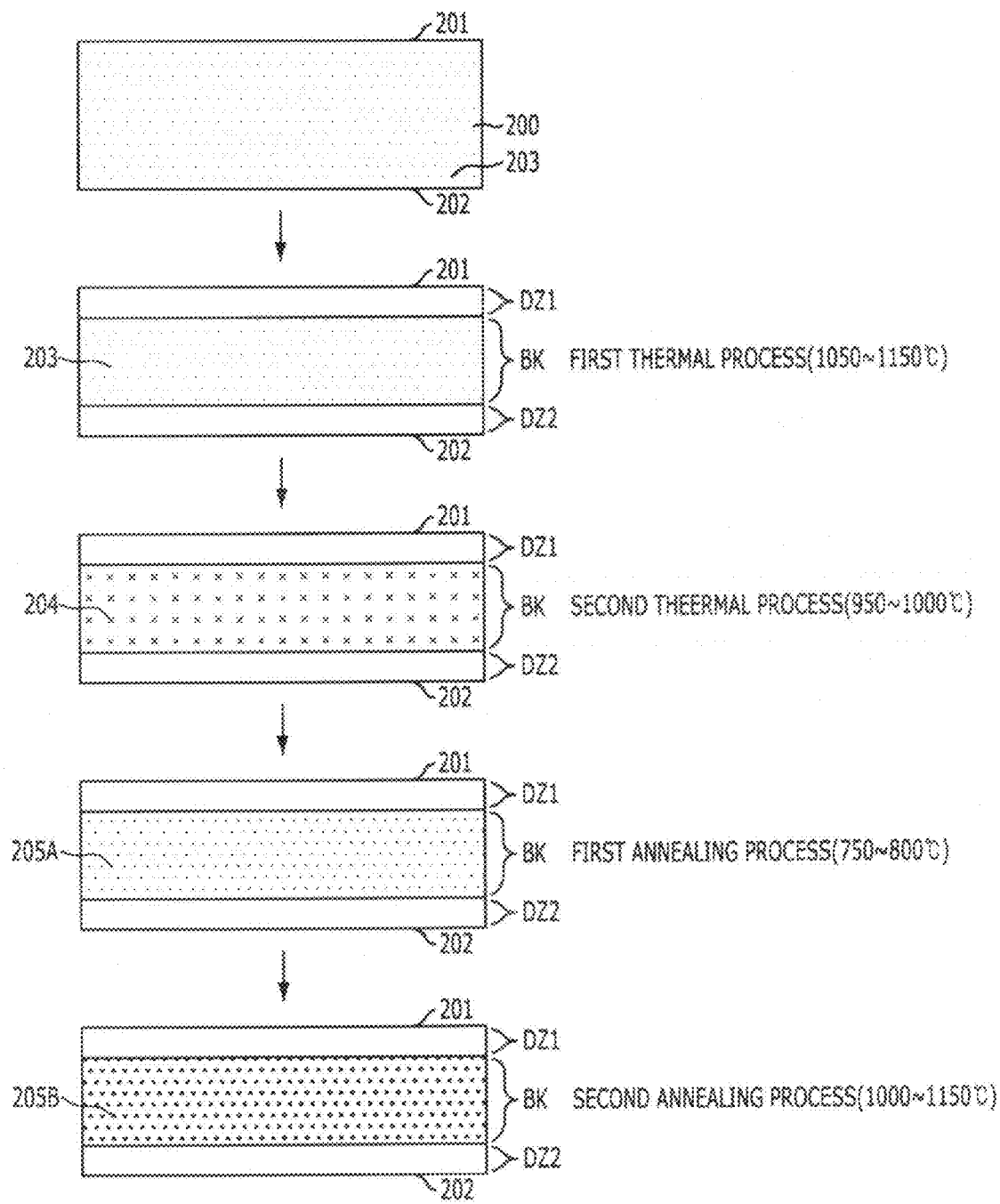
FIG. 2 is a cross-sectional view illustrating a method for fabricating a silicon wafer in accordance with a first embodiment of the present invention.

FIG. 2 is a cross-sectional view illustrating a method for fabricating a silicon wafer in accordance with a first embodiment of the present invention.

Referring to FIG. 2, a silicon wafer 200 is prepared. At this time, the silicon wafer 200 may be a bare wafer. The silicon wafer 200 may be formed as following steps. First, after growing single crystalline silicon, the single crystalline silicon is sliced in a shape of wafer. After an etching process is performed to etch surface of the sliced wafer or to round side of the sliced wafer, a top surface 201 and a backside 202 of the silicon wafer 200 are mirror-polished. At this time, the single crystalline silicon is grown using a Czochralski (CZ) crystal growth. Further, the mirror-polishing process to the silicon wafer 200 may be performed after subsequent thermal processes.

A first thermal process to the silicon wafer 200 is performed so that oxide elements 203 between the top surface 201 and the backside 202 of the silicon wafer 200 are diffused to the inside. As a result, first and second denuded zones DZ1 and DZ2 and a bulk area BK are formed. The first thermal process may be an RTP (Rapid Thermal Process) or an annealing process using a furnace apparatus. Preferably, the first thermal process includes the RTP.

To fast diffuse the oxide elements 203 in the top surface 201 and the backside 202 of the silicon wafer 200, the first thermal process is performed at a high temperature using an argon (Ar) gas, a nitrogen ($N_2$) gas, ammonia ($NH_3$) gas or a combination thereof. When the first thermal process is the RTP, the first thermal process is performed at a temperature ranging from 1050° C. to approximately 1150° C. for approximately 10 seconds to approximately 30 seconds. When the first thermal process is the annealing process, the first thermal process is performed at a temperature ranging from 1050° C. to approximately 1150° C. for approximately 100 minutes to approximately 300 minutes.

Next, a second thermal process to the silicon wafer 200 is performed so that the oxide elements 203 in the bulk area BK are bonded. As a result, oxygen precipitate nuclei 204 are generated. Similar to the first thermal process, the second thermal process may be the RTP or the annealing process using a furnace apparatus. Preferably, the second thermal process includes the RTP.

To easily forming the oxygen precipitate nuclei 204, the second thermal process is performed at a temperature lower than that of the first thermal process using an argon (Ar) gas, a nitrogen ($N_2$) gas, ammonia ($NH_3$) gas or a combination thereof. When the second thermal process is the RTP, the second thermal process is performed at a temperature ranging from approximately 950° C. to approximately 1000° C. for approximately 10 seconds to approximately 30 seconds. When the second thermal process is the annealing process, the second thermal process is performed at a temperature ranging from approximately 950° C. to approximately 1000° C. for approximately 100 minutes to approximately 200 minutes.

Subsequently, a first annealing process is performed to the silicon wafer 200 after finishing the second thermal process. The first annealing process is performed using a furnace apparatus. By heating the silicon wafer 200 at a predetermined temperature lower than that of the second thermal process, the oxygen precipitate nuclei 204 in the bulk area BK are supplementarily generated, and at the same time, oxygen precipitates 205A are generated. Preferably, the first annealing process is performed at a temperature ranging from approximately 750° C. to approximately 800° C. for approximately 100 minutes to approximately 180 minutes. Further, the first annealing process is performed under oxygen ($O_2$) gas atmosphere.

A second annealing process is performed to the silicon wafer 200 after finishing the first annealing process. The second annealing process is also performed using a furnace apparatus. By heating the silicon wafer 200 at a predetermined temperature higher than that of the first annealing process, the oxygen precipitates 205A are enlarged. As a result, enlarged oxygen precipitates 205B are generated. Preferably, the second annealing process is performed at a temperature ranging from approximately 1000° C. to approximately 1150° C. for approximately 100 minutes to approximately 180 minutes. Further, the second annealing process is performed under oxygen ($O_2$) gas atmosphere.

Hereinafter, the first and second annealing processes are described in detail. Hereinafter, the first and second annealing processes are referring to as a two-step annealing process.

Figure 6:
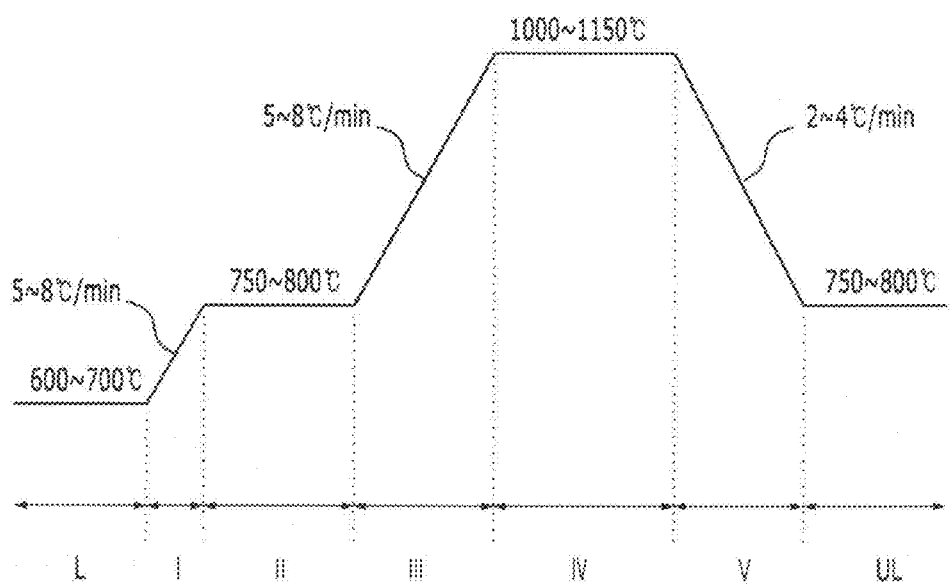
FIG. 6 is a graph illustrating two-step annealing process method in accordance with an embodiment of the present invention.

FIG. 6 is a graph illustrating a two-step annealing process in accordance with an embodiment of the present invention.

Referring to FIG. 6, the annealing process using a furnace apparatus includes a first annealing process (II) of annealing the silicon wafer 200 at a first temperature using oxygen ($O_2$) gas, and performing a second annealing process (IV) of annealing the silicon wafer 200 at a second temperature higher than the first temperature. Each of the first and second annealing processes (II, IV) is performed for approximately 100 minutes to approximately 180 minutes. The first temperature of the first annealing process (II) ranges from approximately 750° C. to approximately 800° C., and the second temperature of the second annealing process (IV) ranges from approximately 1000° C. to approximately 1150° C.

To improve effects of an oxidation process and a heat treatment process, the two-step annealing process in accordance with the embodiment of the present invention may further includes a loading process (L) of loading the silicon wafer 200 into the inside of the furnace apparatus and then maintaining the silicon wafer 200 to a loading temperature for a predetermined duration before the first annealing process (II). Also, after the second annealing process (IV), the two-step annealing process in accordance with the embodiment of the present invention may further include an unloading process (UL) of maintaining the silicon wafer 200 to an unloading temperature for a predetermined duration before the silicon wafer 200 is unloaded from the outside of the furnace apparatus.

The loading temperature of the loading process (L) is lower than that of the first temperature. Preferably, the loading temperature ranges from approximately 600° C. to approximately 700° C. The oxygen gas is not supplied into the furnace apparatus during the loading process (L). Resultantly, the silicon wafer 200 is not oxidized during the loading process (L). The unloading temperature of the unloading process (UL) is substantially equal to the first temperature. Preferably, the unloading temperature ranges from approximately 750° C. to approximately 800° C. During the unloading process (UL), the oxygen gas is not supplied but only a nitrogen gas is supplied. A flow rate of the nitrogen gas ranges from approximately 9 slm to approximately 11 slm.

In addition, the two-step annealing process in accordance with the embodiment of the present invention may further include a first heating-up process (I) for heating up the loading temperature to the first temperature between the loading process (L) and the first annealing process (II), and a second heating-up process (III) for heating up the first temperature to the second temperature between the first annealing process (II) and the second annealing process (IV). When a ramp-up rate per minute is too high during the first and second heating-up processes (I, III), a wafer structure may be deformed. Accordingly, the ramp-up rate in the first and second heating-up processes (I, III) may be set to a range of approximately 5° C./min to approximately 8° C./min.

Also, the two-step annealing process in accordance with the embodiment of the present invention may further include a cooling-down process (V) for cooling down the second temperature to the unloading temperature between the second annealing process (IV) and the unloading process (UL). A ramp-down rate of the cooling-down process (V) may be in the range of approximately 2° C./min to approximately 4° C./min.

In the two-step annealing process in accordance with the embodiment of the present invention, the annealing of the silicon wafer 200 is mostly achieved substantially during the first and second annealing processes (II, IV) because the oxygen gas is only supplied during these processes. A flow rate of the oxygen gas supplied during the first and second annealing processes (II, IV) may range from approximately 50 sccm to approximately 120 sccm. Each of the first and second annealing processes (II, IV) may be performed for approximately 100 minutes to approximately 180 minutes.

Figure 3:
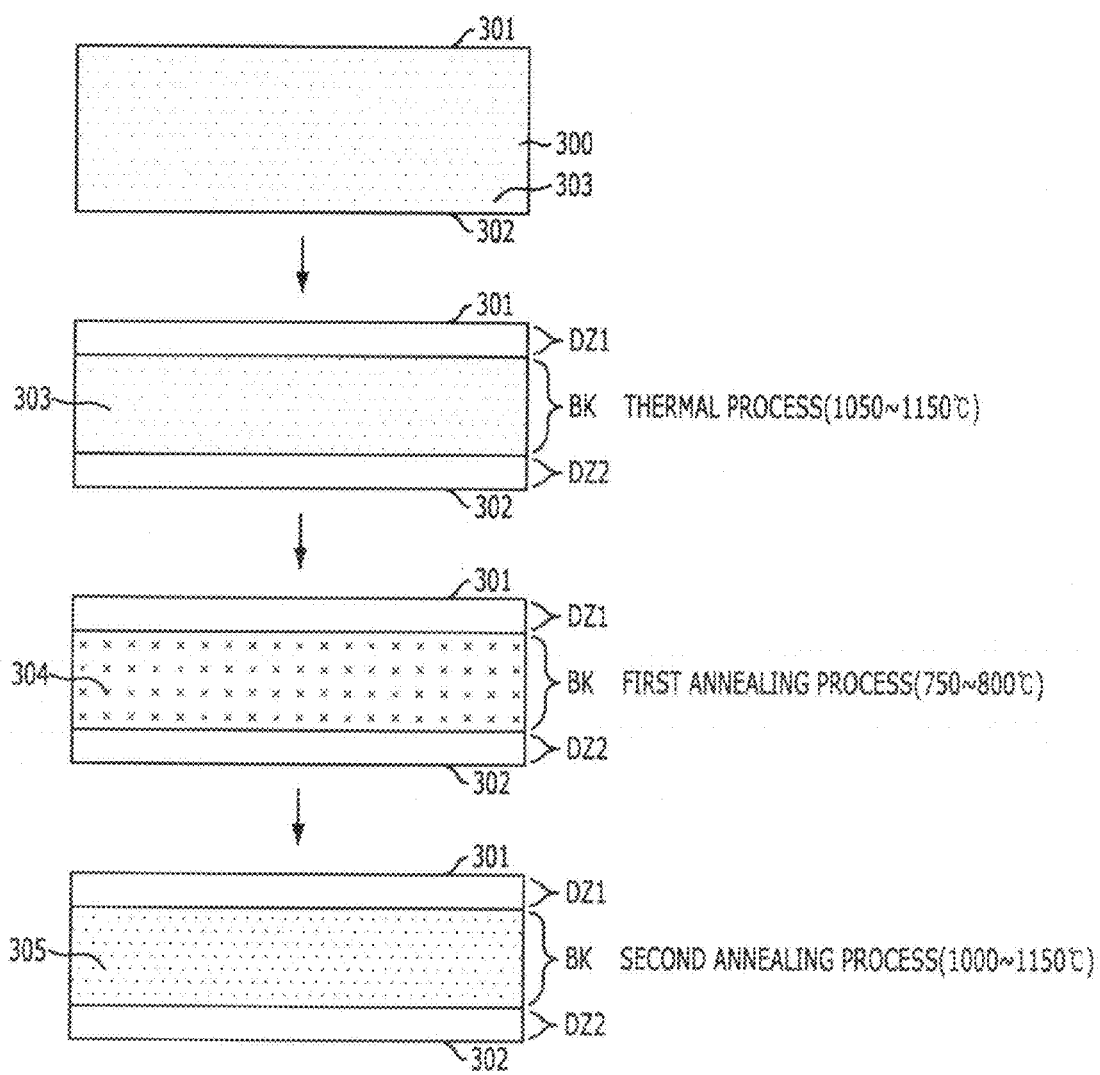
FIG. 3 is a cross-sectional view illustrating a method for fabricating a silicon wafer in accordance with a second embodiment of the present invention.
Figure 4:
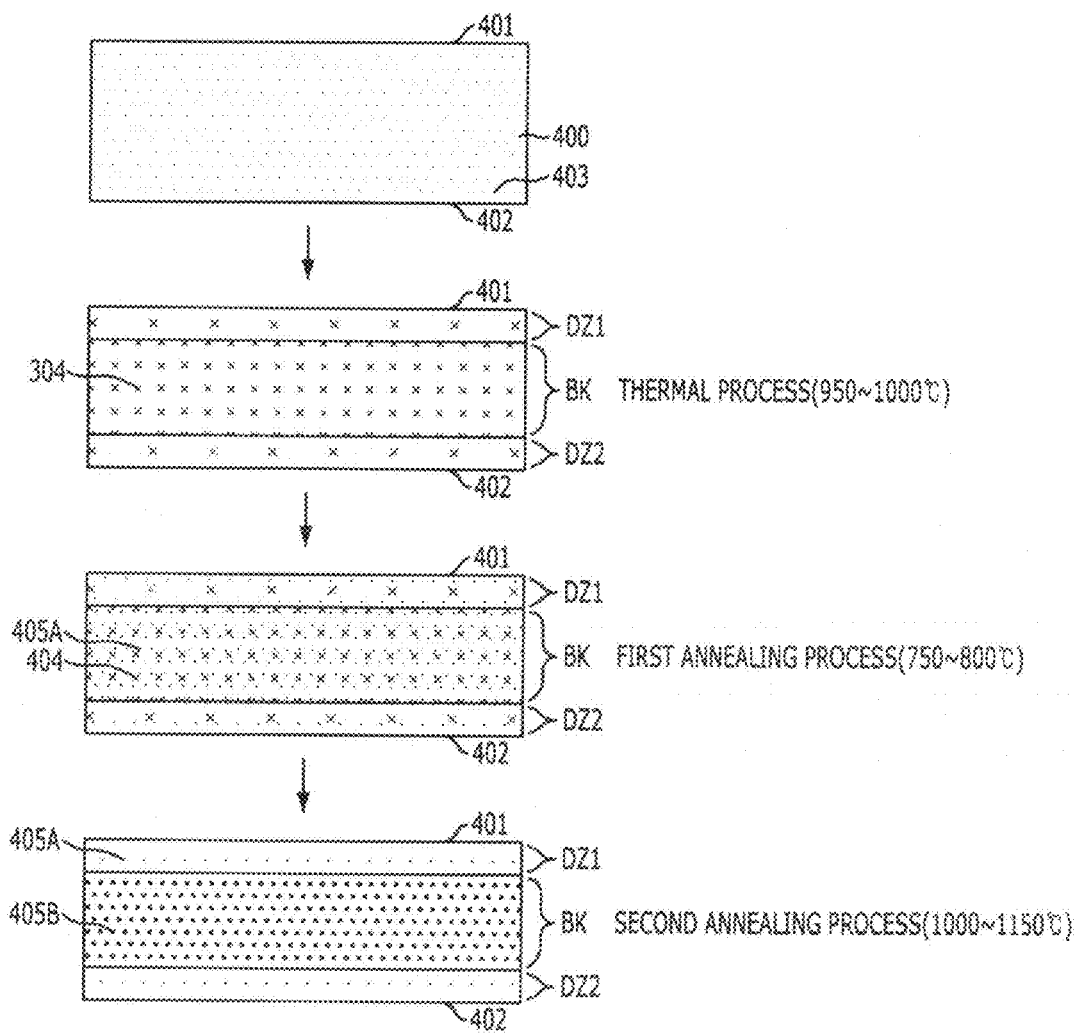
FIG. 4 is a cross-sectional view illustrating a method for fabricating a silicon wafer in accordance with a third embodiment of the present invention.
Figure 5:
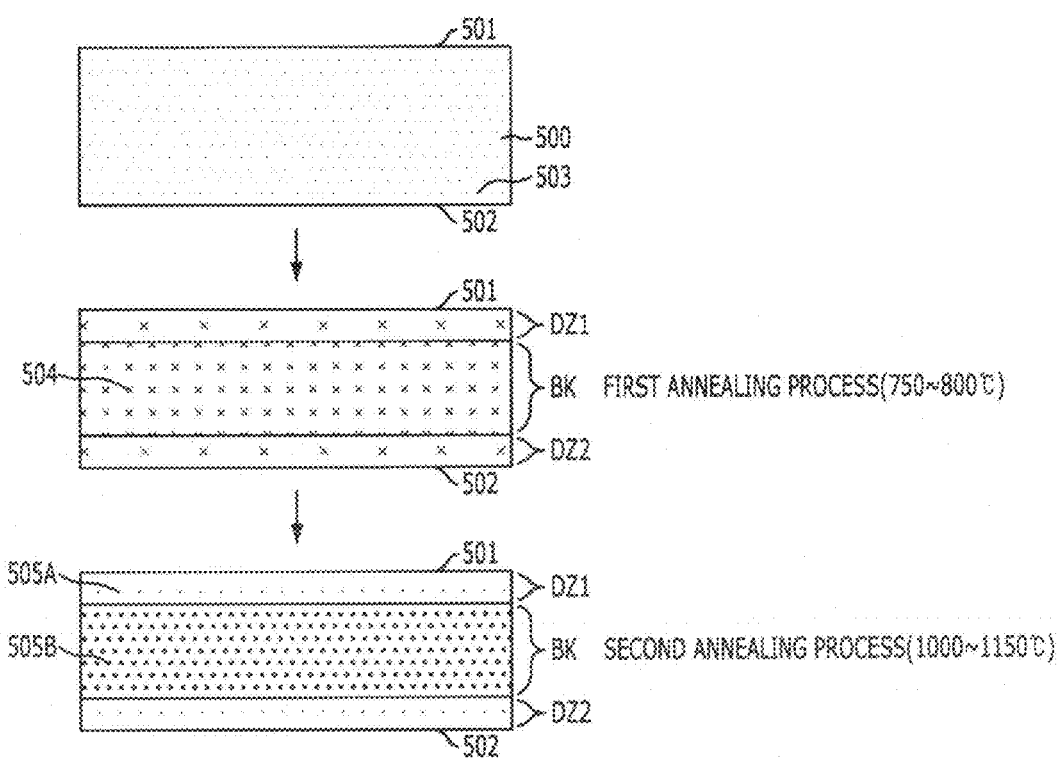
FIG. 5 is a cross-sectional view illustrating a method for fabricating a silicon wafer in accordance with a fourth embodiment of the present invention.

The two-step annealing process as described in FIG. 6 may be applied to the first and second annealing process of a method for fabricating a silicon wafer in accordance with following embodiments of the present invention shown in FIGS. 3 to 5.

FIG. 3 is a cross-sectional view illustrating a method for fabricating a silicon wafer in accordance with a second embodiment of the present invention.

Referring to FIG. 3, a thermal process to the silicon wafer 300 is performed so that oxide elements 303 between a top surface 301 and a backside 302 of the silicon wafer 300 are diffused to the inside. As a result, first and second denuded zones DZ1 and DZ2 and a bulk area BK are formed. The thermal process may be an RTP or an annealing process using a furnace apparatus. Preferably, the first thermal process includes the RTP.

To fast diffuse the oxide elements 303 of the top surface 301 and the backside 302 of the silicon wafer 300, the thermal process is performed at a high temperature. When the thermal process is the RTP, the thermal process is performed at a temperature ranging from 1050° C. to approximately 1150° C. for approximately 10 seconds to approximately 30 seconds. When the thermal process is the annealing process, the thermal process is performed at a temperature ranging from 1050° C. to approximately 1150° C. for approximately 100 minutes to approximately 200 minutes.

Subsequently, a first annealing process is performed to the silicon wafer 300 so that the oxide elements 203 in the bulk area BK are bonded. As a result, oxygen precipitate nuclei 304 are formed. The first annealing process is performed using a furnace apparatus at a predetermined temperature lower than that of the thermal process. Preferably, the first annealing process is performed at a temperature ranging from approximately 750° C. to approximately 800° C. for approximately 100 minutes to approximately 180 minutes. Further, the first annealing process is performed under oxygen ($O_2$) gas atmosphere.

A second annealing process is performed to the silicon wafer 300. The second annealing process is also performed using a furnace apparatus. By heating the silicon wafer 300 at a predetermined temperature higher than that of the first annealing process, oxygen precipitates 305 are generated. Preferably, the second annealing process is performed at a temperature ranging from approximately 1000° C. to approximately 1150° C. for approximately 100 minutes to approximately 180 minutes. Further, the second annealing process is performed under oxygen ($O_2$) gas atmosphere.

FIG. 4 is a cross-sectional view illustrating a method for fabricating a silicon wafer in accordance with a third embodiment of the present invention.

In FIG. 4, a thermal process prior to a first annealing process is performed at a temperature lower than that of the thermal process of FIG. 3.

Referring to FIG. 4, the thermal process to the silicon wafer 400 is performed at a temperature lower than that of the thermal process of FIG. 3. Accordingly, oxygen precipitate nuclei 404 are generated. Because the thermal process is performed at a low temperature, the oxygen precipitate nuclei 404 are formed in first and second denuded zones DZ1 and DZ2 as well as a bulk area BK. The thermal process may be an RTP or an annealing process. Preferably, the first thermal process includes the RTP. When the thermal process is the RTP, the thermal process is performed at a temperature ranging from approximately 950° C. to approximately 1000° C. for approximately 10 seconds to approximately 30 seconds. When the thermal process is the annealing process, the thermal process is performed at a temperature ranging from approximately 950° C. to approximately 1000° C. for approximately 100 minutes to approximately 200 minutes.

Subsequently, first and second annealing processes are sequentially performed to the silicon wafer 400 so that the oxygen precipitate nuclei 404 and oxygen precipitates 405A are generated. The first and second annealing processes are performed under conditions equal to those of the first and second annealing processes of FIG. 3.

FIG. 5 is a cross-sectional view illustrating a method for fabricating a silicon wafer in accordance with a fourth embodiment of the present invention.

Referring to FIG. 5, unlike the annealing processes shown in FIGS. 2 to 4, the annealing process in accordance with the fourth embodiment of the present invention does not require an additional thermal process prior to first and second annealing processes. That is, a silicon wafer 500 of a bare wafer is provided, and the first and second annealing processes are sequentially performed to the silicon wafer 500 so that first and second denude zones DZ1 and DZ2 and a bulk area BK are formed. The first and second annealing processes are performed under conditions equal to those of the first and second annealing processes shown in FIGS. 2 to 4.

In FIG. 5, a reference '501' denotes a top surface, '502' denotes a backside, '503' denotes oxide elements, '504' denotes oxygen precipitate nuclei, '505A' denotes oxygen precipitates, and '505B' denotes enlarged oxygen precipitates.

As described above, the method for fabricating the silicon wafer in accordance with the present invention is described with reference to FIGS. 2 to 5. As previously stated, in the first to third embodiments shown in FIGS. 2 to 4, the RTP is prefer to use the thermal process prior to the first and second annealing process.

Internal defects of the oxygen precipitates or void defects in the silicon wafer may be controlled during growing single crystalline silicon, or controlled by the thermal process after growing the single crystalline silicon. As described above, the thermal process may include the RTP using a halogen lamp and the annealing process using a furnace apparatus.

The annealing process using the furnace apparatus is performed at a high temperature higher than approximately 1000° C. for a long time more than approximately 100 minutes under an argon (Ar) gas or hydrogen ($H_2$) atmosphere. Through diffusion of oxide elements in the silicon wafer and a silicon rearrangement by this annealing process, a device perfect zone, i.e., a defect free zone (DFZ), is formed in a portion of the top surface of the silicon wafer. However, this annealing process has difficulties to control contaminations or slip dislocations of the silicon wafer due to a high-temperature heat treatment according as a size of the silicon wafer is increased.

Accordingly, the RTP gets characteristics of the silicon wafer superior to the annealing process. However, when evaluating the silicon wafer fabricated by the RTP using various defects detection method, the oxygen precipitates are controlled only within a depth of approximately 3 um to approximately 10 um from the top surface. Further, there is a limit to accomplish high BMD density within the bulk area when the silicon wafer is fabricated by only performing the RTP once or twice. More specifically, when the silicon wafer is fabricated by performing the RTP once, the BMD density is determined within a range from $1*10^6$ ea/cm$^2$ to $3*10^6$ ea/cm$^2$, and it is difficult to make the BMD density beyond that.

In the embodiments of the present invention, as shown in FIGS. 2 to 4, the two-step annealing process is performed after the thermal process, thereby removing the void defects and the oxygen precipitates near to the top surface of the silicon wafer. As a result, the present invention can secure a defect free zone (DFZ) and increase the BMD density including bulk stack defects and oxygen precipitates in the bulk area to thereby improve gettering effects by increasing gettering sites in the bulk area.

Hereinafter, referring to Tables. 1 and 2, characteristics of the silicon wafer fabricated by the embodiments of the present invention will be described in detail.

TABLE 1

|  | Condition 1 | Condition 2 | Condition 3 | Condition 4 |
|---|---|---|---|---|
| High Temp. RTP | 1050~1150° C. | 1050~1150° C. | omitted | omitted |
| Low Temp. RTP | 950~1000° C. | omitted | 950~1000° C. | omitted |
| Low Temp. Annealing Process | 750~800° C. | 750~800° C. | 750~800° C. | 750~800° C. |
| High Temp. Annealing Process | 1000~1150° C. | 1000~1150° C. | 1000~1150° C. | 1000~1150° C. |

TABLE 2

|  | Condition 1 | | | Condition 2 | | | Condition 3 | | | Condition 4 | | |
|---|---|---|---|---|---|---|---|---|---|---|---|---|
| Oi (PPMA) | 10.3 | 11.6 | 12.7 | 10.3 | 11.6 | 12.7 | 10.3 | 11.6 | 12.7 | 10.3 | 11.6 | 12.7 |
| BMD density (ea/cm$^2$) | $3.03 \times 10^6$ | $5.43 \times 10^6$ | $8.85 \times 10^6$ | $4.32 \times 10^5$ | $9.35 \times 10^5$ | $2.35 \times 10^6$ | $2.12 \times 10^5$ | $7.12 \times 10^5$ | $1.25 \times 10^6$ | $3.85 \times 10^5$ | $5.12 \times 10^5$ | $9.50 \times 10^5$ |
| DZ depth (μm) | 38.5 | 28.7 | 24.5 | 36.5 | 29.01 | 24.7 | 52.9 | 42.10 | 34.6 | 57.6 | 40.3 | 32.5 |

In Table. 1, the 'High Temp. RTP' and 'Low Temp. RTP' are performed under a rapid thermal treatment for approximately 10 seconds to approximately 30 seconds using an argon (Ar) gas, a nitrogen ($N_2$) gas, ammonia ($NH_3$) gas or a combination thereof. The 'Low Temp. Annealing Process' and 'High Temp. Annealing Process' are performed for approximately 100 minutes to approximately 180 minutes using oxygen ($O_2$) gas.

In Tables. 1 and 2, the 'Condition 1' denotes the first embodiment shown in FIG. 2, the 'Condition 2' denotes the second embodiment shown in FIG. 3, the 'Condition 3' denotes the third embodiment shown in FIG. 4, and the 'Condition 4' denotes the fourth embodiment shown in FIG. 5. Table. 2 shows the BMD density and the denuded zone (DZ) depth according to oxygen concentration (Oi) in each condition.

Figure 7:
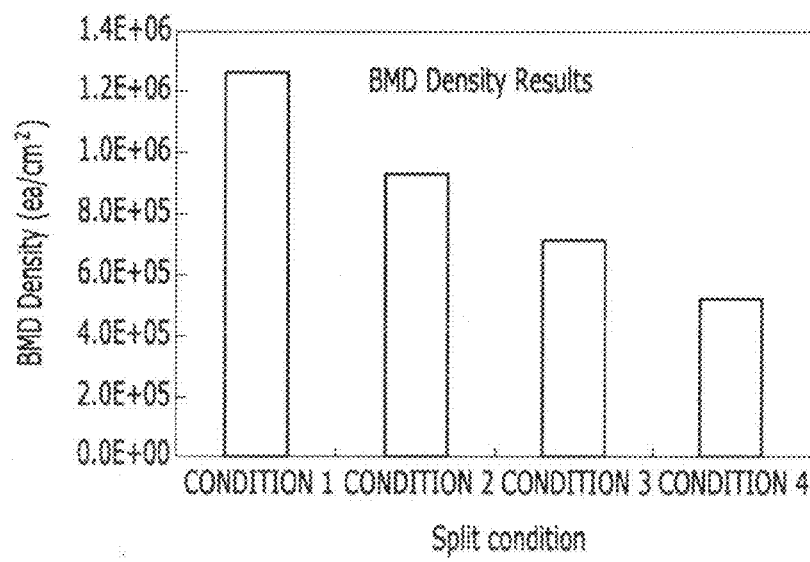
FIG. 7 is a graph illustrating a BMD density under various conditions.
Figure 8:
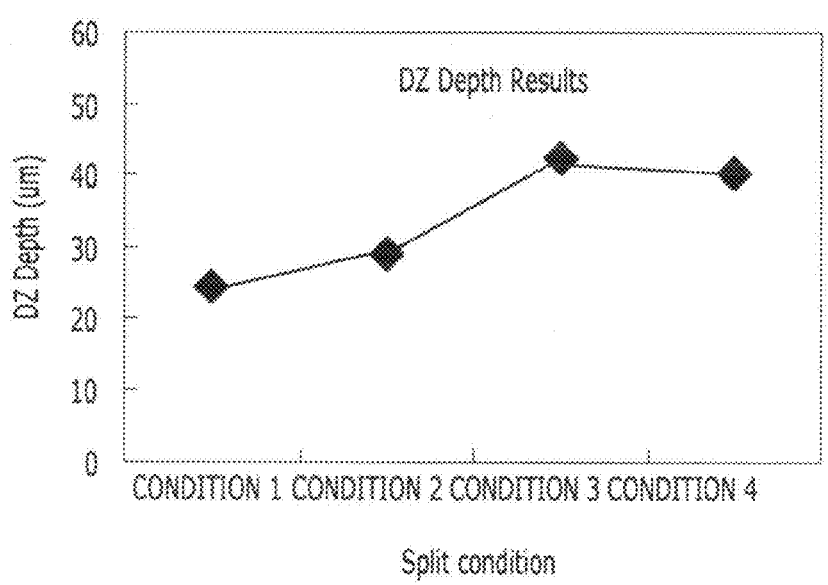
FIG. 8 is a graph illustrating a depth of a denude zone under various conditions.
Figure 9:
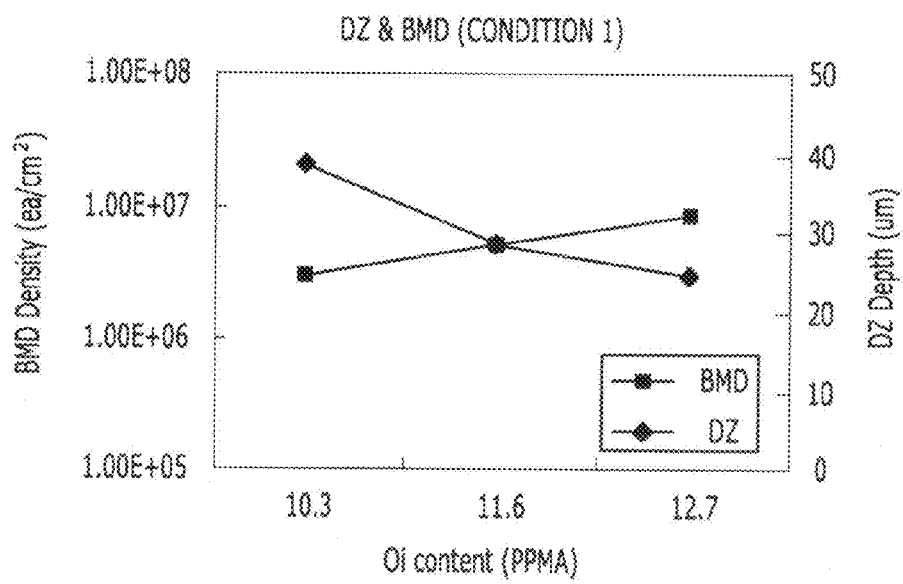
FIGS. 9 to 12 are graphs illustrating a BMD density and a depth of a denude zone according to a concentration of oxygen under various conditions.
Figure 10:
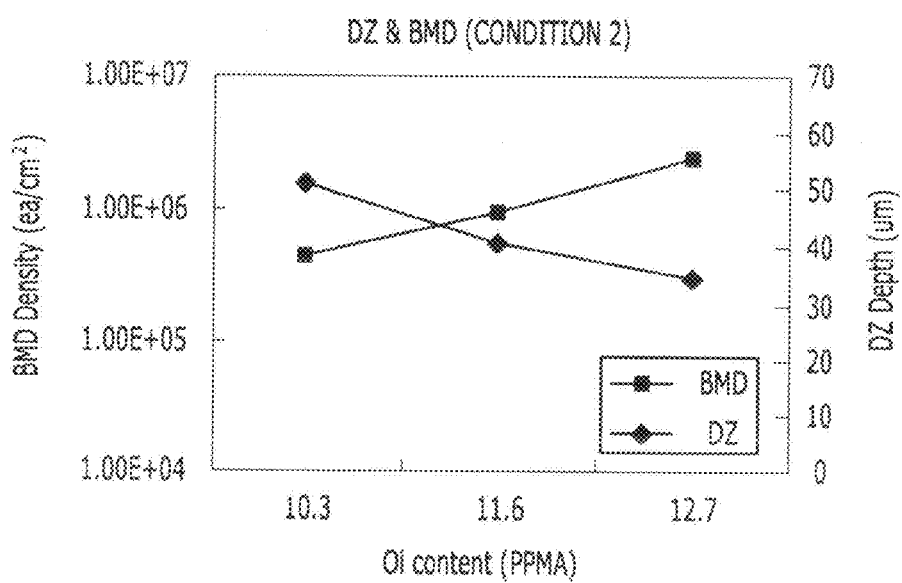
Figure 11:
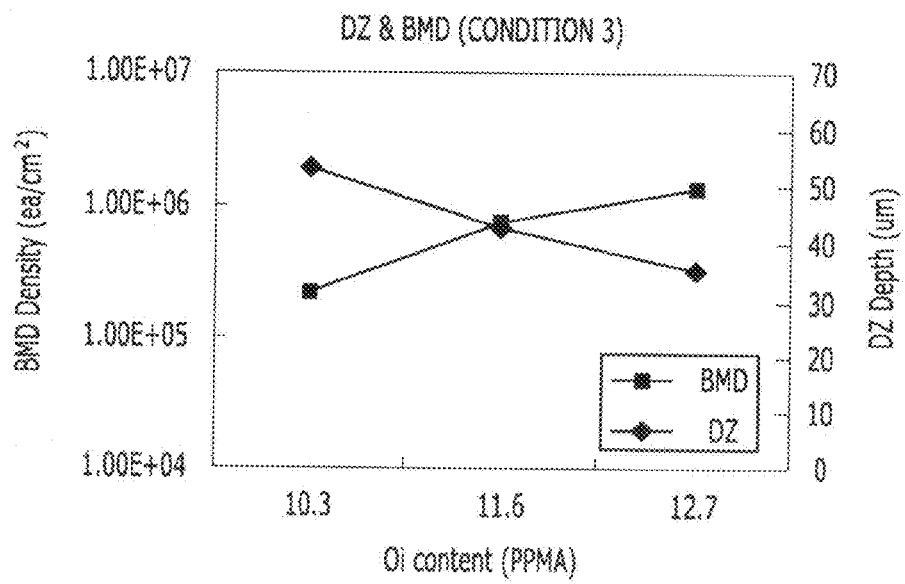
Figure 12:
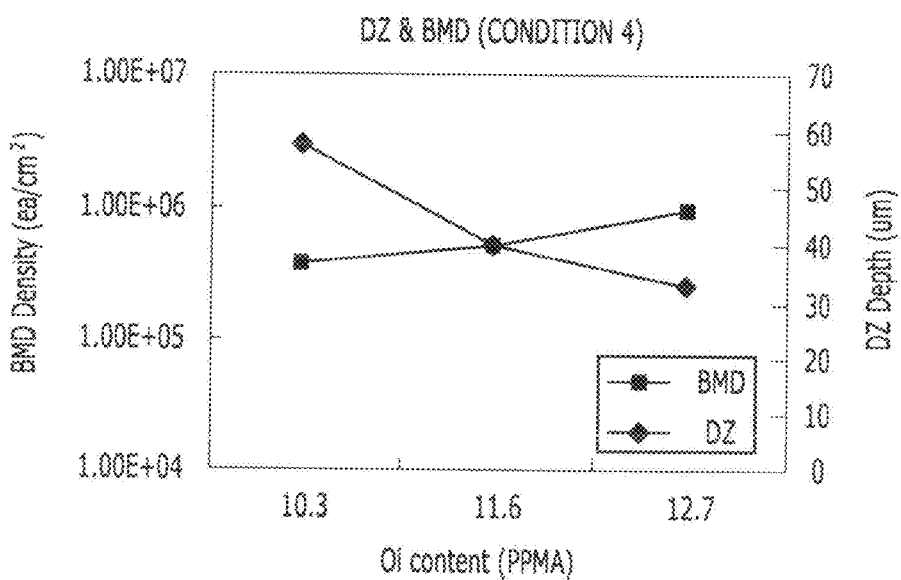

FIGS. 7 to 12 are graphs showing parameters of Tables. 1 and 2. In detail, FIG. 7 is a graph illustrating the BMD density with respect to each condition. FIG. 8 is a graph illustrating the DZ depth with respect to each condition. FIGS. 9 to 12 are graphs illustrating the oxygen concentration in the bulk area with respect to each condition.

Referring to Table. 2 and FIG. 7, the BMD density more than $1 \times 10^5$ ea/cm$^2$ is obtained under all the conditions. Particularly, the BMD density more than $1 \times 10^6$ ea/cm$^2$ is obtained under Condition 1 regardless of the oxygen concentration. Though data relating to the BMD density of the silicon wafer, which is fabricated by only performing the RTP once or twice, are not presented, it is predictable that the BMD density may be significantly lower in comparison with the BMD density under the above conditions.

As previously stated, the metallic contaminations are controlled by gettering the BMDs. However, because the BMD density has a tendency to be decreased during a high-temperature process, it requires securing high BMD density during fabricating the silicon wafer. In general, a semiconductor device needs high-voltage devices operating under high-voltage circumstances. To fabricate this high-voltage device, a severe ion implantation process and a high-temperature annealing process are necessarily performed because a junction region, i.e., a doping region, having a deep profile is required. When the BMD density is decreased during the high-temperature annealing process, a ring-shaped dislocation occurs after following shallow trench isolation (STI) due to not only defects evaluation but also low gettering ability.

As results of measuring the BMD density, the ring-shaped dislocation partially occurs when the BMD density is approximately $2.5*10^5$ ea/cm$^2$, but does not occur when the BMD density is approximately $4.4*10^5$ ea/cm$^2$. Therefore, it requires controlling the BMD density more than at least $1*10^5$ ea/cm$^2$. In the present embodiment, regardless of the conventional thermal process during fabricating the silicon wafer, the two-step annealing process is additionally performed for an initial process for fabricating the semiconductor device. The initial process includes an oxidation process which is performed prior to an ion plantation for forming a well. The oxidation process corresponds to a process for forming a screen oxide layer during an ion plantation for forming a well (Hereinafter, referring to as a well ion plantation).

Referring to Table. 2 and FIG. 8, the DZ depth according to each condition is shown. The DZ depth is closely related to the BMD density and the oxygen concentration. As the BMD density and the oxygen concentration are increased, the DZ depth becomes decreased. When the oxygen concentration is the same under each condition, e.g., 11.6 in Table. 2, the BMD density in the conditions 1 and 2 is higher than that of the conditions 3 and 4, but the DZ depth in the conditions 1 and 2 is lower than that of the conditions 3 and 4. Accordingly, the DZ depth may be a measure of the BMD density.

Referring to Table. 2 and FIGS. 9 to 12, the BMD density and the DZ depth according to the oxygen concentration under each condition are shown. As the oxygen concentration (Oi) is increased, the BMD density becomes increased but the DZ depth becomes decreased. Accordingly, the oxygen concentration (Oi) is also a measure of the BMD density. That is, the BMD density in the bulk area may be calculated by measuring the DZ depth and the oxygen concentration (Oi).

Figure 13:
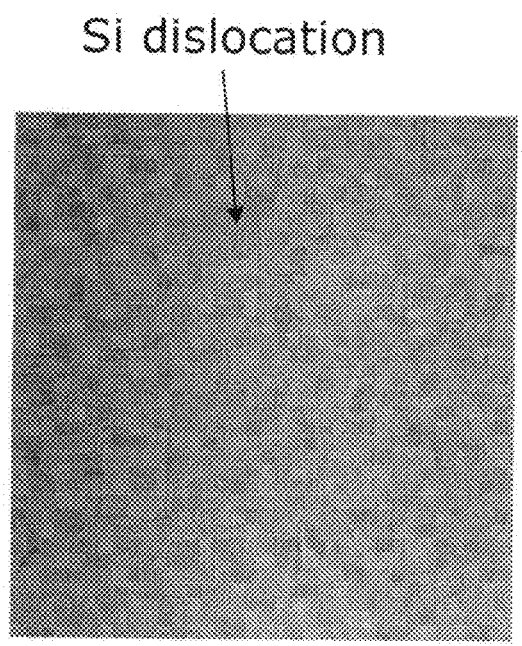
FIG. 13 is a cross-sectional view of a silicon wafer fabricated according to a comparative example.
Figure 14:
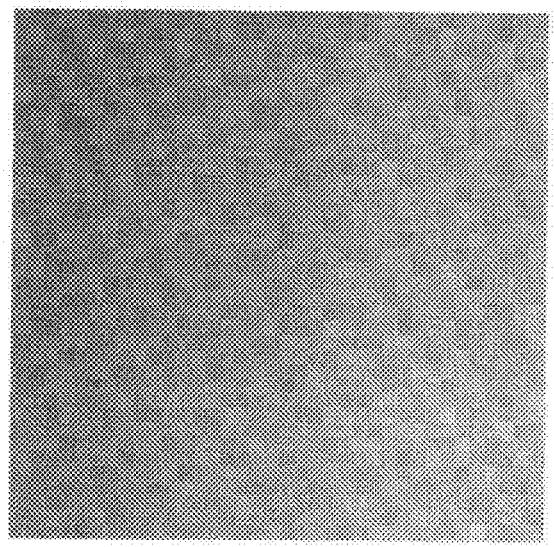
FIG. 14 is a cross-sectional view of a silicon wafer fabricated in accordance with an embodiment of the present invention.

FIGS. 13 and 14 are cross-sectional views of a silicon wafer.

In detail, FIG. 13 shows a cross-sectional view of a silicon wafer fabricated by performing only an RTP without a two-step annealing process, and FIG. 14 shows a cross-sectional view of a silicon wafer fabricated by performing a two-step annealing process in accordance with an embodiment of the present invention.

As shown, a plurality of silicon dislocations occur in the silicon wafer of FIG. 13, but there are no silicon dislocations in the silicon wafer of FIG. 14. Further, when forming an epitaxial layer by using an epitaxial growth, crystal defects in the bulk area of the silicon wafer where the epitaxial layer is formed are significantly reduced.

Figure 15:
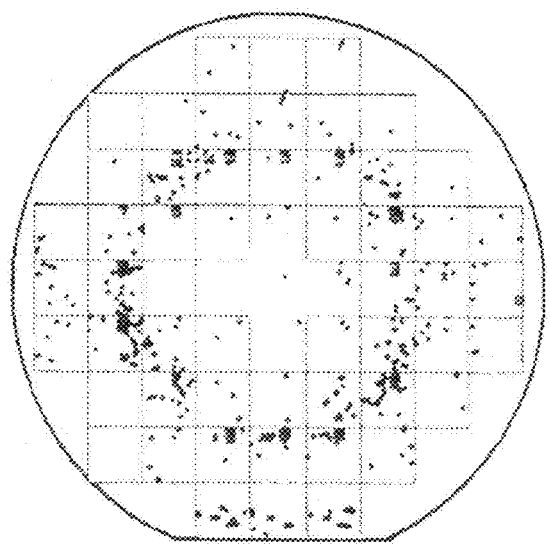
FIG. 15 illustrates a crystal defect map of a bulk area in a silicon wafer fabricated according to a comparative example.
Figure 16:
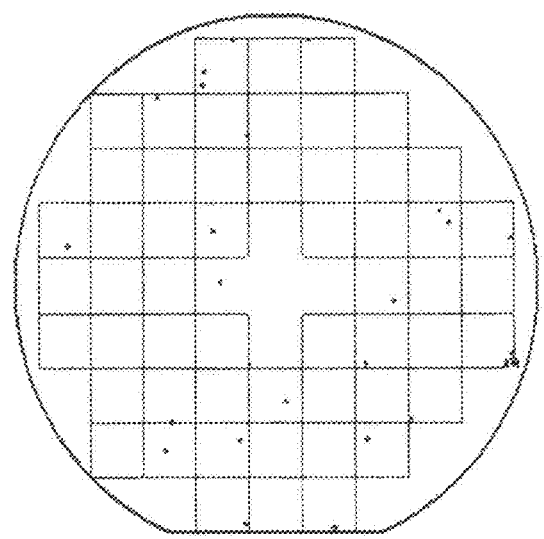
FIG. 16 illustrates a crystal defect map of a bulk area in a silicon wafer fabricated by using a two-step annealing process in accordance with an embodiment of the present invention.

FIGS. 15 and 16 illustrate crystal defect maps of the bulk area in the silicon wafer where the epitaxial layer is formed. This inspection is performed using an inspection apparatus fabricated by KLA Corporation.

As shown in FIG. 15, lots of crystal defects are distributed in the map when performing an oxidation process without the two-step annealing process. Herein, the oxidation process forms a screen oxide layer during a well ion plantation. On the contrary, as shown in FIG. 16, crystal defects are significantly decreased when performing the oxidation process with the two-step annealing process of the present invention.

Hereinafter, referring to FIGS. 17A to 17D, a method for fabricating a semiconductor device having a well for a high-voltage device will be described in detail, the method including a two-step annealing process in accordance with an embodiment of the present invention.

FIGS. 17A to 17D are cross-sectional views illustrating a method for fabricating a semiconductor device in accordance with an embodiment of the present invention.

Figure 17A:
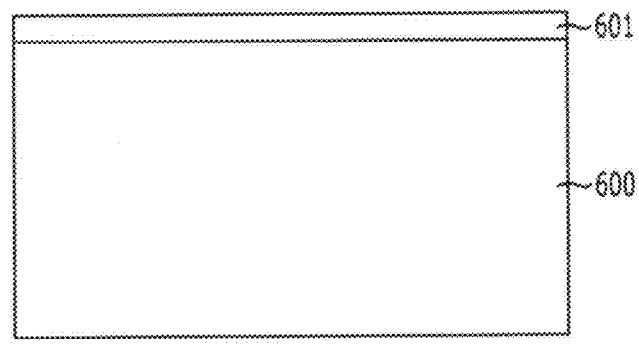
FIGS. 17A to 17D are cross-sectional views illustrating a method for fabricating a semiconductor device in accordance with an embodiment of the present invention.

Referring to FIG. 17A, a screen oxide layer 601 is formed on a silicon wafer 600 using the two-step annealing process shown in FIG. 6. The silicon wafer 600 may be a wafer to which the RTP is applied once or twice as described in FIGS. 2 to 4, or a bare wafer to which no RTP is applied as described in FIG. 5. The screen oxide layer 601 may be a silicon oxide layer, and formed to a thickness ranging from approximately 100 Å to approximately 140 Å.

Figure 17B:
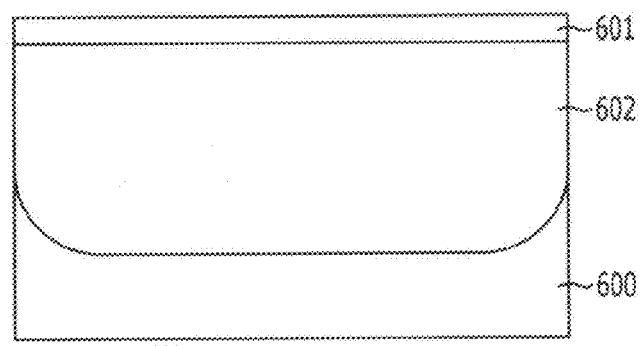

Referring to FIG. 17B, a well 602 is formed to a predetermined depth in the silicon wafer 600. The well 602 may have a p-type or an n-type conductive type depending on the conductive type of a high-voltage device.

The well 602 is formed through an ion implantation process and a diffusion process. It is difficult to form a well for a high-voltage device using only the ion implantation process. Therefore, the diffusion process as well as the ion implantation process should be performed additionally after completing the ion implantation process in order to form the well 602 having a doping profile of FIG. 17B. The diffusion process is performed for a long time through an annealing process using a high-temperature heating apparatus such as a furnace. Preferably, the diffusion process is performed at a temperature ranging from 1100° C. to approximately 1250° C. for approximately 6 hours to approximately 10 hours using only a nitrogen ($N_2$) gas.

Figure 17C:
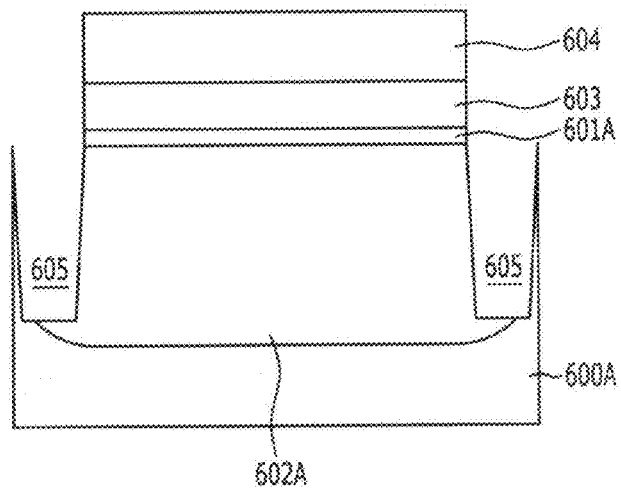

Referring to FIG. 17C, a pad nitride layer (not shown) acting as a hard mask is formed on the screen oxide layer 601, or the pad nitride layer is formed on a buffer layer (not shown) which is formed by performing an additional oxidation process after removing the screen oxide layer 601. The reason why the screen oxide layer 601 is removed is that the screen oxide layer 601 is improper to a buffer layer because it gets damaged during the ion implantation process. A photoresist pattern 604 for forming an STI trench is then formed on the pad nitride layer.

The pad nitride layer may be formed through a low pressure chemical vapor deposition (LPCVD) process so as to prevent the silicon wafer 600 from being damaged by minimizing stress applied to the silicon wafer 600 during a deposition process. The pad nitride layer may be formed of silicon nitride. The pad nitride layer may be formed to a thickness ranging from approximately 1400 Å to approximately 2000 Å.

The pad nitride layer, the screen oxide layer 601 and the silicon wafer 600 are partially etched in sequence using the photoresist pattern 604 as an etch mask, thereby forming a pad nitride pattern 603, a screen oxide pattern 601A, a silicon wafer 600A and a well 602A. As a result, a trench 605 having a predetermined depth and slope angle is formed in the silicon wafer 600A.

Figure 17D:
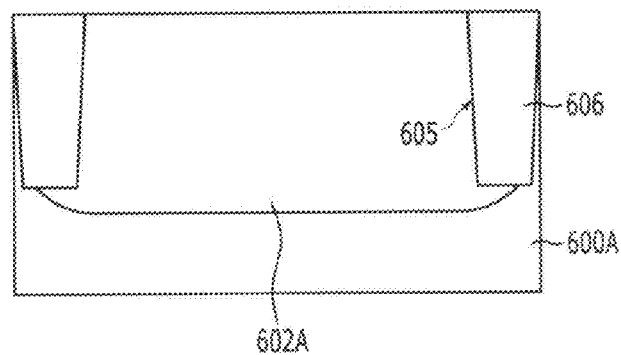

Referring to FIG. 17D, a device isolation structure 606 filling the trench 605 is formed and thereafter, the pad nitride pattern 603 and the screen oxide pattern 601A are removed. The device isolation structure 606 may be formed of a high density plasma (HDP) layer having good gap-fill property.

Advantageous effects of the above embodiment of the present invention will be described below while comparing the inventive method with a comparative example. The inventive method includes forming the screen oxide layer through an oxidation process using the two-step annealing process, and the comparative example includes forming the screen oxide layer through an oxidation process using one-step annealing process. In the oxidation process of this comparative example, the silicon wafer was oxidized at a single temperature ranging from 800° C. to 850° C. using a wet oxidation process.

FIGS. 18 to 21 illustrate defects in silicon wafers prepared by an oxidation process of the comparative example.

Figure 18:
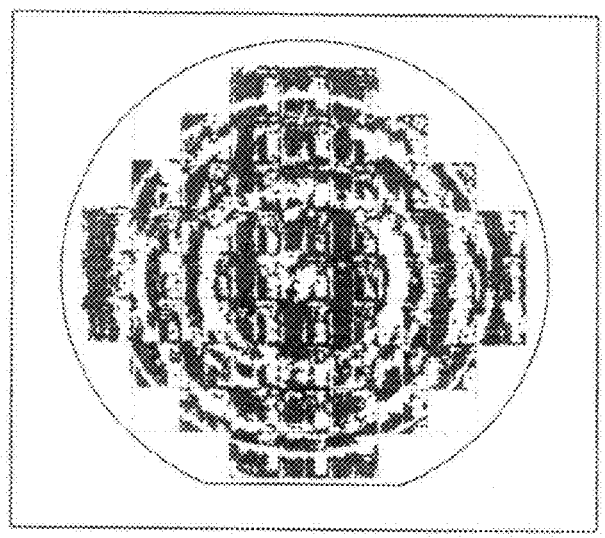
FIG. 18 illustrates an inspection result of crystal defects in a silicon wafer prepared according to a comparative example.

In detail, FIG. 18 illustrates map data of crystal defects inspected by an inspection apparatus fabricated by KLA Corporation after forming a trench through an STI process in a silicon wafer prepared by the oxidation process of the comparative example. As shown in FIG. 18, it can be observed that crystal defects such as ring-shaped silicon dislocations exist in most of defective wafers.

Figure 19:
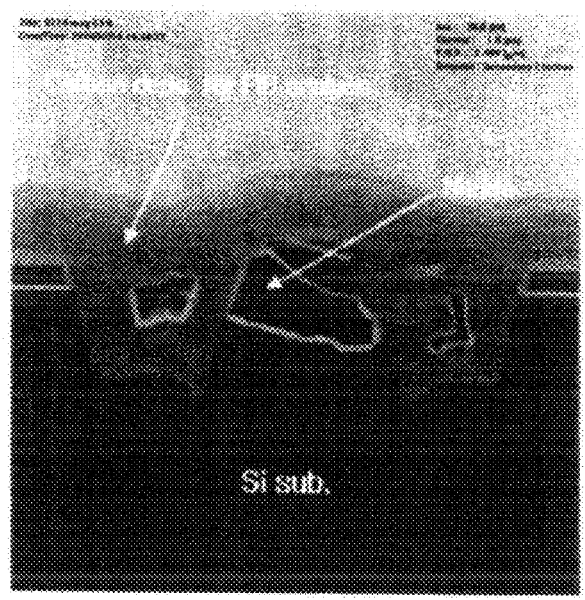
FIG. 19 is a scanning electron microscopic (SEM) picture of a silicon wafer prepared by an oxidation process of the comparative example.
Figure 20:
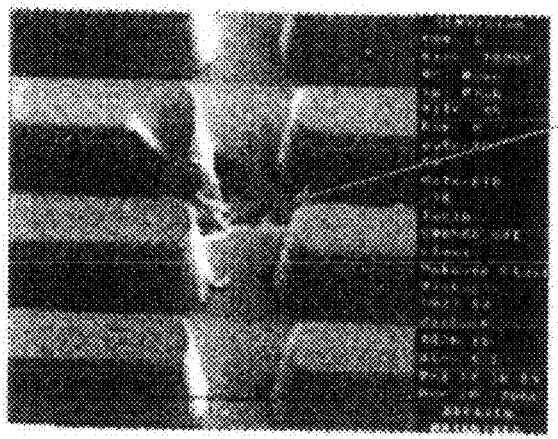
FIG. 20 is a plan image of a silicon wafer prepared by an oxidation process of the comparative example.

FIGS. 19 and 20 are scanning electron microscopic (SEM) pictures of a silicon wafer taken by an inspection apparatus fabricated by KLA Corporation.

To be specific, FIG. 19 is a SEM image showing a section of the silicon wafer, and FIG. 20 is a plan-tilt STM image. As shown FIGS. 19 and 20, it can be observed that there are crystal defects and dislocations.

Figure 21:
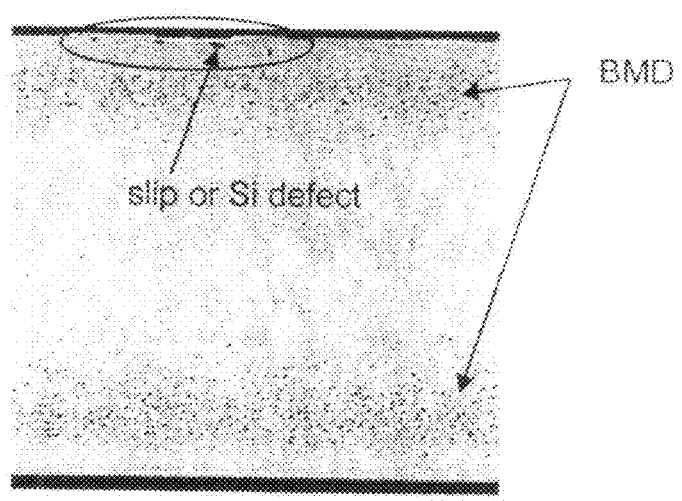
FIG. 21 is a microscopic picture showing a BMD density analysis on a silicon wafer prepared by an oxidation process of the comparative example.

FIG. 21 is a micrograph showing a bulk micro-defect (BMD) density analysis on a silicon wafer having ring-shaped defects.

As shown in FIG. 21, it can be observed that most BMDs are closely formed to a top surface of the silicon wafer but few BMDs are formed in a central portion of the silicon wafer, i.e., in the bulk area. That is, the BMD density of the bulk area is significantly lower than that of the top surface of the silicon wafer.

Figure 22:
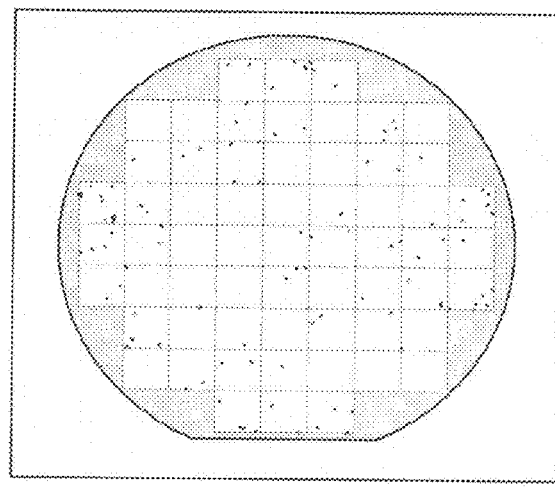
FIG. 22 illustrates an inspection result for crystal defects of a silicon wafer in accordance with an embodiment of the present invention.
Figure 23:
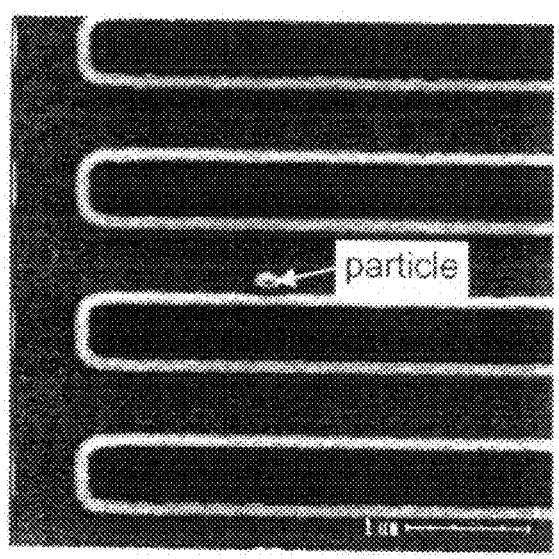
FIG. 23 is a plan image of a silicon wafer in accordance with an embodiment of the present invention.
Figure 24:
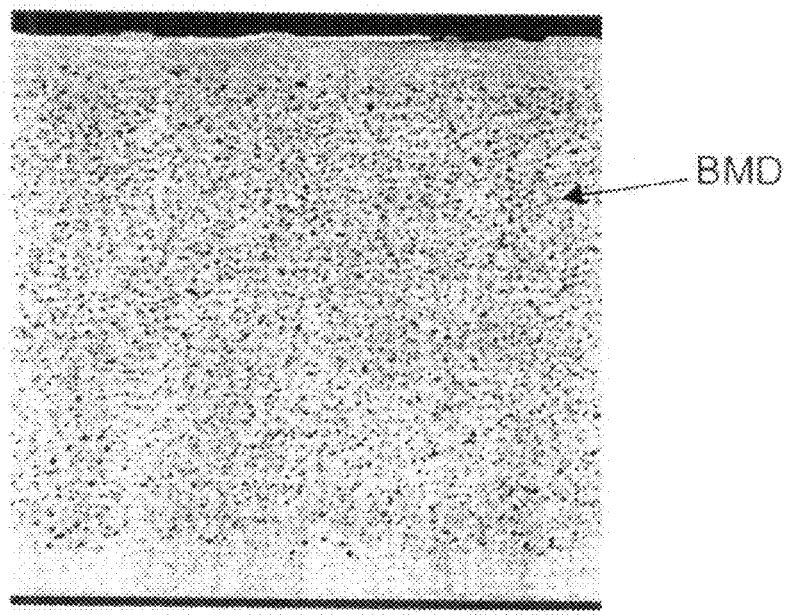
FIG. 24 is a micrograph showing a BMD density analysis on a silicon wafer in accordance with an embodiment of the present invention.

FIGS. 22 to 24 are an inspection result of crystal defects in a silicon wafer prepared by an oxidation process using a two-step annealing process in accordance with the embodiment of the present invention. This inspection is performed using an inspection apparatus fabricated by KLA Corporation.

In detail, FIG. 22 illustrates an inspection result of crystal defects of a silicon wafer after forming a trench through an STI process in the silicon wafer prepared by an oxidation process using a two-step annealing process of the present invention. As shown in FIG. 22, it can be observed that crystal defects are removed, and only some particles or dusts are detected.

FIG. 23 is a plan tilt STM image of a silicon wafer taken by an inspection apparatus fabricated by KLA Corporation. As similar to the result of FIG. 22, it can be observed that only some particles are detected.

FIG. 24 is a micrograph showing a BMD density analysis on a silicon wafer prepared by an oxidation process using a two-step annealing process of the present invention. As shown in FIG. 24, it can be observed that BMDs are uniformly formed over the silicon wafer.

Figure 25:
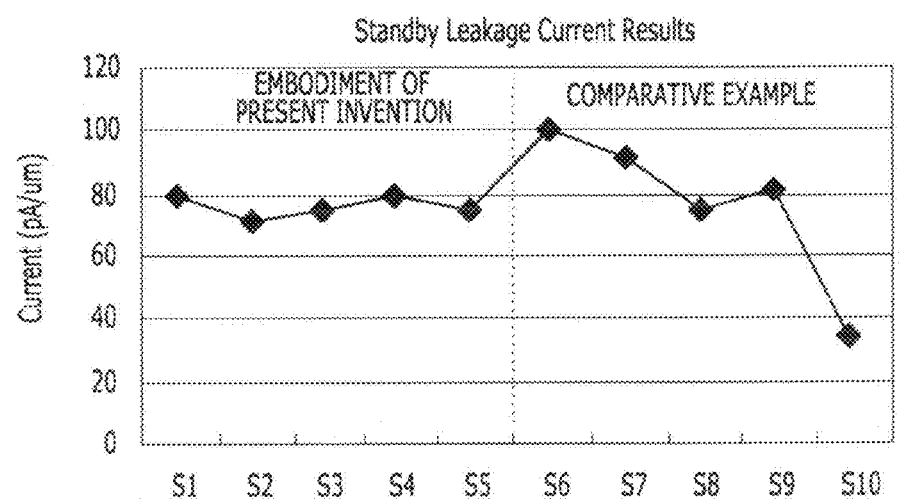
FIG. 25 is a graph illustrating comparison results of leakage current during a standby mode of a Static Random Access Memory (SRAM).

FIG. 25 is a graph illustrating comparison results of leakage current during a standby mode of a static random access memory (SRAM). In FIG. 25, the left view shows samples of high-voltage devices prepared by the oxidation process using the two-step annealing process of the present invention, and the right view shows samples of high-voltage devices of the comparative example. As shown in FIG. 25, it can be observed that the samples prepared by the oxidation process of the present invention exhibit uniform leakage current characteristic in comparison with the samples prepared by the oxidation process of the comparative example.

Figure 26:
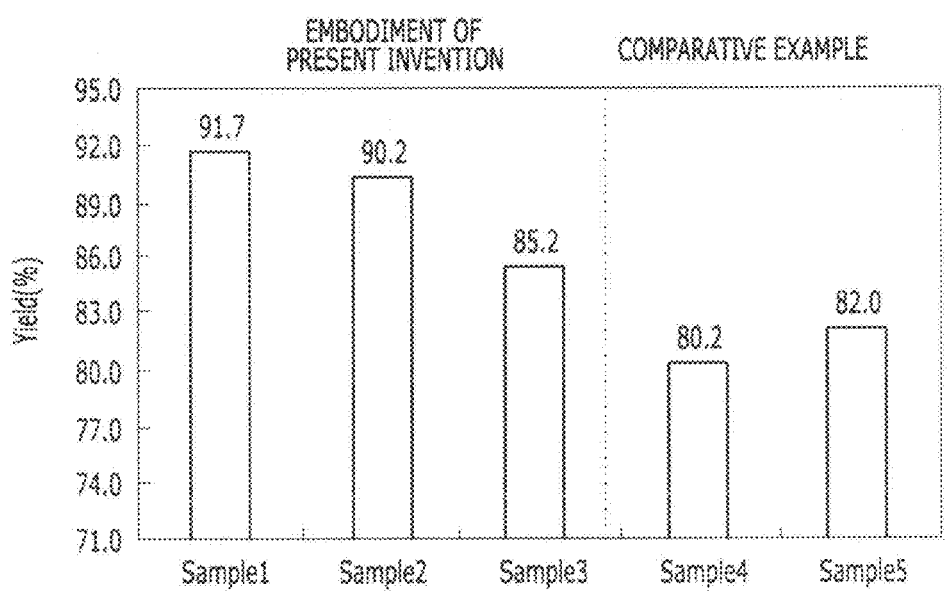
FIG. 26 is a graph illustrating comparison results of production yield.

FIG. 26 is a graph illustrating comparison results of production yield. In FIG. 26, the left view shows samples of high-voltage devices prepared by the oxidation process using the two-step annealing process of the present invention, and the right view shows samples of high-voltage devices of the comparative example. As shown in FIG. 26, it can be observed that the production yield of the samples prepared by the oxidation process of the present invention is higher by approximately 5-9% than the samples of the comparative example.

In accordance with the present invention, first, gettering sites can be sufficiently produced in a silicon wafer by performing a two-step annealing process at different temperatures. This makes it possible to prevent crystal defects from being generated due to a thermal budget caused by a following high-temperature heat treatment process.

Second, the present invention may provide a silicon wafer having high and uniform BMD density in a bulk area by performing a two-step annealing process at different temperatures.

Third, in accordance with the present invention, an epitaxial layer is formed over a silicon wafer using an epitaxial growth after performing a two-step annealing process to the silicon wafer at different temperatures. As a result, the present invention may provide a semiconductor device to which the epitaxial layer of excellent characteristics is formed.

Fourth, in accordance with the present invention, after a screen oxide layer is formed over a silicon wafer by performing a two-step annealing process to the silicon wafer at different temperatures, a well is formed in the silicon wafer by performing an ion implantation process using the screen oxide layer as an ion mask. As a result, the present invention may sufficiently produce gettering sites in the silicon wafer to thereby prevent crystal defects from being generated due to a thermal budget caused by a following high-temperature heat treatment process.

While the present invention has been described with respect to the specific embodiments, it will be apparent to those skilled in the art that various changes and modifications may be made without departing from the spirit and scope of the invention as defined in the following claims.

What is claimed is:

1. A method of semiconductor processing, comprising:
   thermally processing a silicon wafer to form a denuded zone and a bulk area in the silicon wafer;
   loading the thermally processed silicon wafer into a heating apparatus at a loading temperature;
   first heating the loaded silicon wafer from the loading temperature to a first temperature;
   first annealing the first-heated silicon wafer at the first temperature to generate oxygen precipitates in the first-heated silicon wafer;
   second heating the first-annealed silicon wafer directly from the first temperature to a second temperature, the second temperature being greater than the first temperature;
   second annealing the second-heated silicon wafer at the second temperature to enlarge and increase a density of the oxygen precipitates in the second-heated silicon wafer;
   cooling the second-annealed silicon wafer from the second temperature to an unloading temperature; and
   unloading the cooled silicon wafer from the heating apparatus at the unloading temperature;
   wherein the thermally processing of the silicon wafer occurs prior to the loading of the thermally processed silicon wafer.

2. The method of claim 1, wherein the loading temperature ranges from approximately 600° C. to approximately 700° C.

3. The method of claim 1, wherein a ramp-up rate of the first heating of the loaded silicon wafer ranges from approximately 5° C./min to approximately 8° C./min.

4. The method of claim 1, wherein the first temperature ranges from approximately 750° C. to approximately 800° C.

5. The method of claim 1, wherein a ramp-up rate of the second heating of the first-annealed silicon wafer ranges from approximately 5° C./min to approximately 8° C./min.

6. The method of claim 1, wherein the second temperature ranges from approximately 1000° C. to approximately 1150° C.

7. The method of claim 1, wherein a ramp-down rate of the cooling of the second-annealed silicon wafer ranges from approximately 2° C./min to approximately 4° C./min.

8. The method of claim 1, wherein the unloading temperature ranges from approximately 750° C. to approximately 800° C.

9. The method of claim 1, wherein the unloading of the silicon wafer is performed using nitrogen ($N_2$) gas.

10. The method of claim 1, wherein the first and second annealing are performed by using oxygen ($O_2$) gas.

11. The method of claim 1, wherein the silicon wafer comprises a non-doped silicon wafer.

12. A method of semiconductor processing, comprising:
   thermally processing a non-doped silicon wafer to form a denuded zone and a bulk area in the silicon wafer;
   loading the thermally processed silicon wafer into a heating apparatus at a loading temperature;

first heating the loaded non-doped silicon wafer from the loading temperature to a first temperature;

first annealing the first-heated non-doped silicon wafer at the first temperature to generate oxygen precipitates in the first-heated silicon wafer;

second heating the first-annealed non-doped silicon wafer directly from the first temperature to a second temperature, the second temperature being greater than the first temperature;

second annealing the second-heated silicon wafer at the second temperature to enlarge and increase a density of the oxygen precipitates in the second-heated silicon wafer;

cooling the second-annealed silicon wafer from the second temperature to an unloading temperature; and unloading the cooled silicon wafer from the heating apparatus at the unloading temperature.

\* \* \* \* \*